United States Patent
Yokoyama et al.

(10) Patent No.: US 10,737,493 B2
(45) Date of Patent: Aug. 11, 2020

(54) PIEZOELECTRIC DEVICE, LIQUID EJECTING HEAD, AND LIQUID EJECTING APPARATUS

(71) Applicant: Seiko Epson Corporation, Tokyo (JP)

(72) Inventors: Naoto Yokoyama, Matsumoto (JP); Eiju Hirai, Azumino (JP); Masao Nakayama, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/357,405

(22) Filed: Mar. 19, 2019

(65) Prior Publication Data

US 2019/0291432 A1 Sep. 26, 2019

(30) Foreign Application Priority Data

Mar. 20, 2018 (JP) ................................. 2018-052883

(51) Int. Cl.
*B41J 2/14* (2006.01)
*H01L 41/09* (2006.01)

(52) U.S. Cl.
CPC ...... *B41J 2/14233* (2013.01); *H01L 41/0973* (2013.01)

(58) Field of Classification Search
CPC ................ B41J 2/14201; B41J 2/14209; B41J 2/14274; B41J 2/14233; H01L 41/0973
See application file for complete search history.

(56) References Cited

U.S. PATENT DOCUMENTS

| 2009/0284568 | A1 | 11/2009 | Yazaki |
| 2013/0194353 | A1* | 8/2013 | Hirai et al. .......... B41J 2/14201 |
| 2014/0043401 | A1* | 2/2014 | Torimoto et al. .... B41J 2/14201 |
| 2016/0221340 | A1* | 8/2016 | Hirai et al. .......... B41J 2/14274 |

FOREIGN PATENT DOCUMENTS

| JP | 2009-172878 A | 8/2009 |
| JP | 2017-132268 A | 8/2017 |

\* cited by examiner

*Primary Examiner* — Juanita D Jackson
(74) *Attorney, Agent, or Firm* — Harness, Dickey & Pierce, P.L.C.

(57) ABSTRACT

A piezoelectric device includes a vibration plate, and a first piezoelectric element and a second piezoelectric element that vibrate the vibration plate. The first piezoelectric element and the second piezoelectric element include a piezoelectric layer extending between the first piezoelectric element and the second piezoelectric element. In a region between the first piezoelectric element and the second piezoelectric element in the piezoelectric layer, a first opening portion and a second opening portion are formed in a second direction intersecting a first direction in which the first piezoelectric element and the second piezoelectric element are disposed so as to interpose a vibration suppressing portion, which is a portion of the piezoelectric layer.

8 Claims, 8 Drawing Sheets

PIEZOELECTRIC DEVICE, LIQUID EJECTING HEAD, AND LIQUID EJECTING APPARATUS

The entire disclosure of Japanese Patent Application No. 2018-052883, filed Mar. 20, 2018 is expressly incorporated by reference herein.

BACKGROUND

1. Technical Field

The present invention relates to a structure of a piezoelectric device suitably used for, for example, a liquid ejecting head.

2. Related Art

To date, there has been proposed a liquid ejecting head that ejects a liquid in a pressure chamber from a nozzle by vibrating a vibration plate that forms a wall surface of the pressure chamber by using a piezoelectric element. For example, JP-A-2017-132268 discloses a structure in which a piezoelectric layer is continuous across a plurality of piezoelectric elements. A single opening portion (slit) is formed between two piezoelectric elements adjacent to each other in the piezoelectric layer.

In the region of the vibration plate corresponding to the opening portion between the piezoelectric elements, cracks may occur, for example, due to repeated excessive vibration. From the viewpoint of effectively suppressing cracks of the vibration plate, the technique of JP-A-2017-132268 has room for further improvement.

SUMMARY

A piezoelectric device according to an aspect of the invention includes a vibration plate, and a first piezoelectric element and a second piezoelectric element that vibrate the vibration plate. The first piezoelectric element and the second piezoelectric element include a piezoelectric layer extending between the first piezoelectric element and the second piezoelectric element. In a region between the first piezoelectric element and the second piezoelectric element in the piezoelectric layer, a first opening portion and a second opening portion are formed in a second direction intersecting a first direction in which the first piezoelectric element and the second piezoelectric element are disposed so as to interpose a vibration suppressing portion, which is a portion of the piezoelectric layer.

A liquid ejecting head according to another aspect of the invention includes a pressure chamber that houses a liquid and a piezoelectric device that ejects the liquid from the pressure chamber. The piezoelectric device includes a vibration plate that forms a wall surface of the pressure chamber, and a first piezoelectric element and a second piezoelectric element that vibrate the vibration plate. The first piezoelectric element and the second piezoelectric element include a piezoelectric layer extending between the first piezoelectric element and the second piezoelectric element. In a region between the first piezoelectric element and the second piezoelectric element in the piezoelectric layer, a first opening portion and a second opening portion disposed in a second direction intersecting a first direction in which the first piezoelectric element and the second piezoelectric element are disposed and a vibration suppressing portion that connects the first piezoelectric element and the second piezoelectric element between the first opening portion and the second opening portion are formed.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
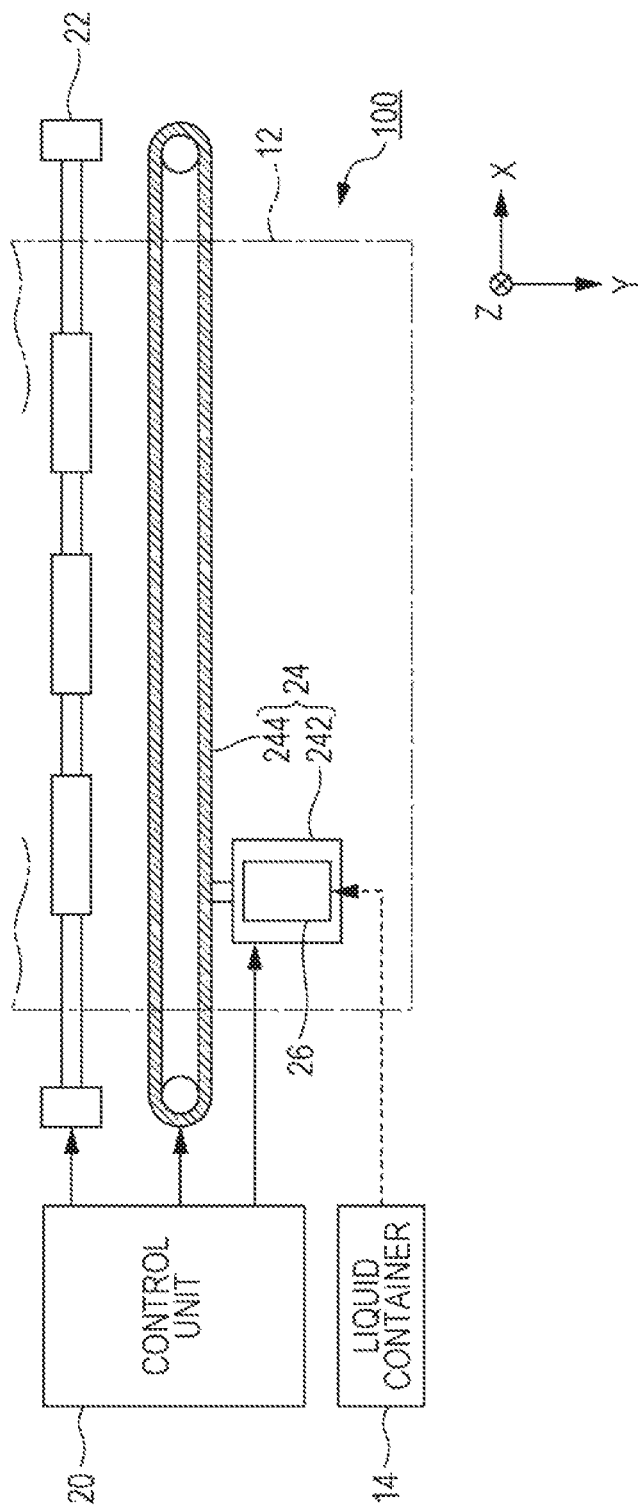
FIG. 1 is a schematic diagram of a liquid ejecting apparatus according to a first embodiment.

FIG. 1 is a schematic diagram illustrating a liquid ejecting apparatus 100 according to a first embodiment of the invention. The liquid ejecting apparatus 100 of the first embodiment is an ink jet printing apparatus that ejects ink, which is an example of a liquid, onto a medium (ejection target object). Typically, the medium 12 is printing paper, but a printing target composed of any material such as a resin film or cloth may be used as the medium 12. As illustrated in FIG. 1, the liquid ejecting apparatus 100 is provided with a liquid container 14 that stores ink. For example, a cartridge attached to the liquid ejecting apparatus 100 so as to be removable, a bag-shaped ink pack formed of a flexible film, or an ink tank capable of replenishing ink may be used as the liquid container 14.

As illustrated in FIG. 1, the liquid ejecting apparatus 100 includes a control unit 20, a transport mechanism 22, a movement mechanism 24, and a liquid ejecting head 26. The control unit 20 includes, for example, a processing circuit such as a central processing unit (CPU) or field programmable gate array (FPGA) and a memory circuit such as a semiconductor memory and integrally controls each component of the liquid ejecting apparatus 100. The transport mechanism 22 transports the medium 12 in a Y direction (an example of a first direction) under the control of the control unit 20.

The movement mechanism 24 reciprocates the liquid ejecting head 26 in an X direction (an example of a second direction) under the control of the control unit 20. The X direction is a direction intersecting (typically perpendicular to) the Y direction in which the medium 12 is transported. The movement mechanism 24 according to the first embodiment includes a transport body 242 (carriage), which is substantially box-shaped and which houses the liquid ejecting head 26, and a transport belt 244 to which the transport body 242 is fixed. Further, a configuration in which a plurality of the liquid ejecting heads 26 are mounted on the transport body 242 or a configuration in which the liquid container 14 is mounted on the transport body 242 together with the liquid ejecting heads 26 may be adopted.

Each of the liquid ejecting heads 26 ejects ink supplied from the liquid container 14 onto the medium 12 from a plurality of nozzles (ejection holes) under the control of the control unit 20. A desired image is formed on the surface of the medium 12 by each of the liquid ejecting heads 26 ejecting ink onto the medium 12 in parallel with the transport of the medium 12 by the transport mechanism 22 and the repetitive reciprocation of the transport body 242.

Figure 2:
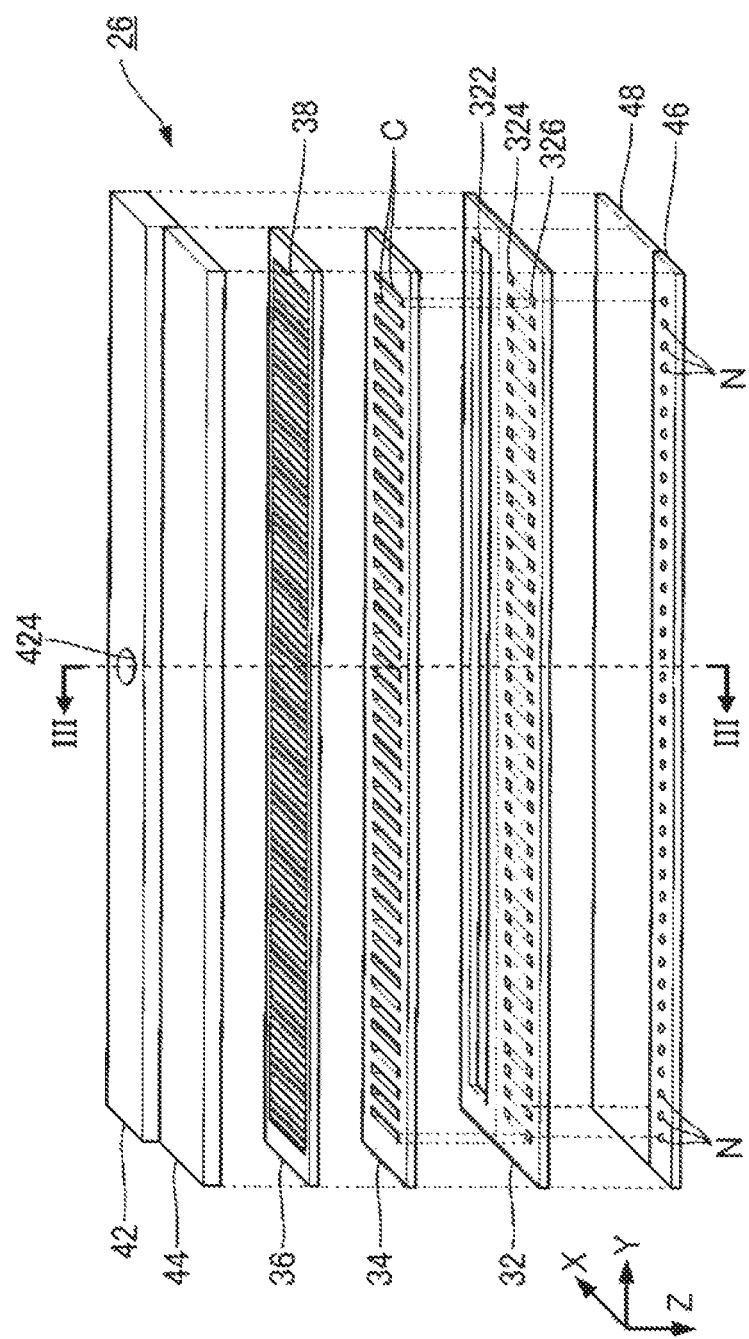
FIG. 2 is an exploded perspective view of a liquid ejecting head.
Figure 3:
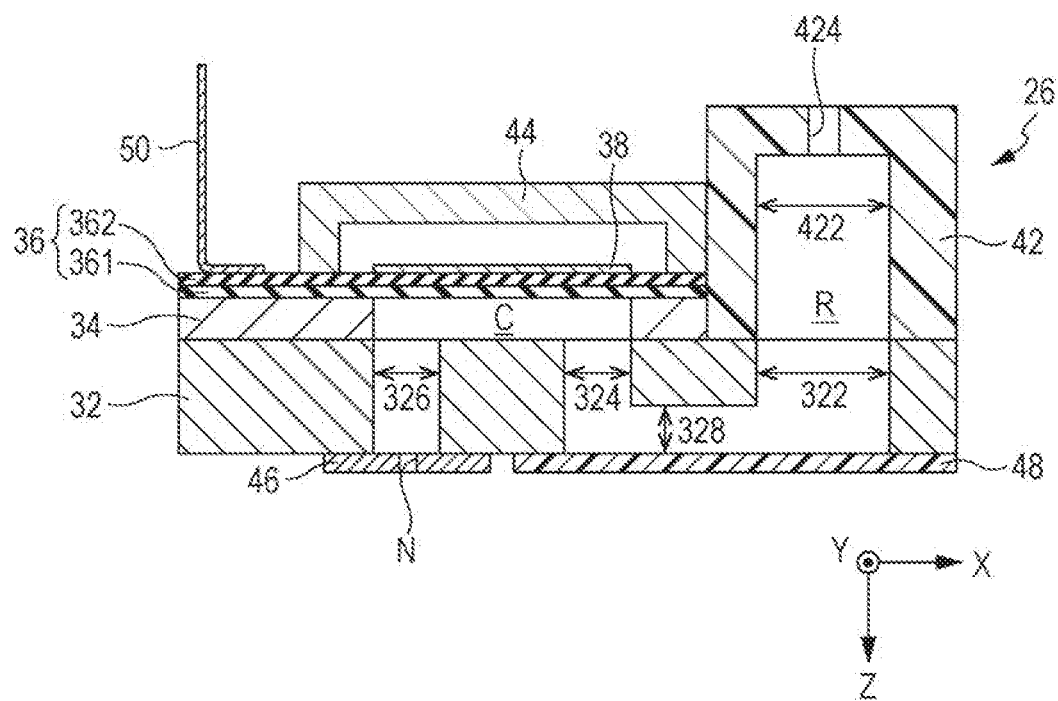
FIG. 3 is a sectional view of the liquid ejecting head (sectional view taken along the line III-III in FIG. 2).

FIG. 2 is an exploded perspective view of the liquid ejecting head 26, and FIG. 3 is a sectional view taken along the line III-III in FIG. 2 (a section parallel to the XZ plane). As illustrated in FIG. 2, the direction perpendicular to the XY plane (for example, a plane parallel to the surface of the medium 12) is hereinafter referred to as a Z direction. The direction of ejection of ink by each of the liquid ejecting heads 26 (typically the vertical direction) corresponds to the Z direction.

As illustrated in FIG. 2 and FIG. 3, the liquid ejecting head 26 includes a flow path substrate 32 that is substantially rectangular and elongated in the Y direction. A pressure chamber substrate 34, a vibration plate 36, a plurality of piezoelectric elements 38, a casing 42, and a sealing body 44 are provided on a surface of the flow path substrate 32 on the negative side in the Z direction. On the other hand, a nozzle plate 46 and a vibration absorber 48 are provided on a surface of the flow path substrate 32 on the positive side in the Z direction. The elements of the liquid ejecting head 26 are each roughly a plate-shaped member elongated in the Y direction like the flow path substrate 32 and are joined to each other using, for example, an adhesive.

As illustrated in FIG. 2, the nozzle plate 46 is a plate-like member formed with a plurality of nozzles N disposed in the Y direction. Each of the nozzles N is a through hole that allows ink to pass therethrough. Further, the flow path substrate 32, the pressure chamber substrate 34, and the nozzle plate 46 are formed by, for example, processing a single-crystal substrate of silicon (Si) by a semiconductor manufacturing technique such as etching. However, the material and the manufacturing method of each element of the liquid ejecting head 26 are arbitrary. The Y direction can also be said to be the direction in which the nozzles N are disposed.

The flow path substrate 32 is a plate member that forms an ink flow path. As illustrated in FIG. 2 and FIG. 3, an opening portion 322, supply flow paths 324, and communication flow paths 326 are formed in the flow path substrate 32. The opening portion 322 is a through hole that is formed in an elongated shape along the Y direction in plan view (that is, viewed from the Z direction) so as to be continuous across the nozzles N. On the other hand, the supply flow paths 324 and the communication flow paths 326 are through holes formed individually for each of the nozzles N. In addition, as illustrated in FIG. 3, a relay flow path 328 extending across the supply flow paths 324 is formed on the surface of the flow path substrate 32 on the positive side in the Z direction. The relay flow path 328 is a flow path that enables the opening portion 322 and the supply flow paths 324 to communicate with each other.

The casing 42 is, for example, a structure manufactured by injection molding of a resin material and is fixed to the surface of the flow path substrate 32 on the negative side in the Z direction. As illustrated in FIG. 3, a housing 422 and an inlet port 424 are formed in the casing 42. The housing 422 is a recessed portion having an outer shape corresponding to the opening portion 322 of the flow path substrate 32 and the inlet port 424 is a through hole that communicates with the housing 422. As can be understood from FIG. 3, the space in which the opening portion 322 of the flow path substrate 32 and the housing 422 of the casing 42 communicate with each other functions as a liquid storage chamber R (reservoir). The ink that has been supplied from the liquid container 14 and passed through the inlet port 424 is stored in the liquid storage chamber R.

The vibration absorber 48 is an element for absorbing pressure fluctuation in the liquid storage chamber R, and is configured to include, for example, a flexible sheet member (compliance substrate) that can be elastically deformed. More specifically, the vibration absorber 48 is provided on the surface of the flow path substrate 32 on the positive side in the Z direction so as to close the opening portion 322, the relay flow path 328, and the supply flow paths 324 of the flow path substrate 32 and form a bottom surface of the liquid storage chamber R.

As illustrated in FIG. 2 and FIG. 3, the pressure chamber substrate 34 is a plate-like member in which a plurality of pressure chambers C corresponding to different nozzles N are formed. The pressure chambers C are disposed along the Y direction. Each of the pressure chambers C (cavities) is an elongated opening extending along the X direction in plan view. The end portion of the pressure chamber C on the positive side in the X direction overlaps with one of the supply flow paths 324 of the flow path substrate 32 in plan view and the end portion of the pressure chamber C on the negative side in the X direction overlaps with one of the communication flow paths 326 of the flow path substrate 32 in plan view.

The vibration plate 36 is provided on a surface of the pressure chamber substrate 34 on the opposite side to the flow path substrate 32. The vibration plate 36 is an elastically deformable plate member. As illustrated in FIG. 3, the vibration plate 36 of the first embodiment is formed by stacking a first layer 361 and a second layer 362. The second layer 362, from the viewpoint of the first layer 361, is located on the opposite side to the pressure chamber substrate 34. The first layer 361 is an elastic film formed of an elastic material such as silicon oxide ($SiO_2$), and the second layer 362 is an insulating film formed of an insulating material such as zirconium oxide ($ZrO_2$). Further, it is also possible to integrally form the pressure chamber substrate 34 and a portion or the whole of the vibration plate 36 by selectively removing a portion of a plate-shaped member having a predetermined plate thickness in the plate thickness direction in the region corresponding to the pressure chamber C.

As can be understood from FIG. 3, the flow path substrate 32 and the vibration plate 36 oppose each other inside each of the pressure chambers C with a space therebetween. The pressure chamber C is located between the flow path substrate 32 and the vibration plate 36 and is a space for applying pressure to the ink filled in the pressure chamber C. The ink stored in the liquid storage chamber R branches from the relay flow path 328 into each of the supply flow paths 324 and is supplied and fills in parallel the pressure chambers C. As can be understood from the above description, the vibration plate 36 constitutes a wall surface of the pressure chamber C (specifically, an upper surface which is one surface of the pressure chamber C).

As illustrated in FIG. 2 and FIG. 3, the piezoelectric elements 38 that correspond to different nozzles N (or pressure chambers C) are provided on a surface of the vibration plate 36 on the opposite side to the pressure chamber C (that is, a surface of the second layer 362). Each of the piezoelectric elements 38 is an actuator that deforms when a drive signal is supplied thereto and is formed in an elongated shape along the X direction in plan view. The piezoelectric elements 38 are disposed in the Y direction so as to correspond to the pressure chambers C. When the vibration plate 36 vibrates in conjunction with the deformation of the piezoelectric element 38, the pressure in the pressure chamber C changes and consequently the ink filled in the pressure chamber C passes through the communication flow path 326 and the nozzle N and is ejected.

The sealing body 44 of FIG. 2 and FIG. 3 is a structure that protects the piezoelectric elements 38 and reinforces the mechanical strength of the pressure chamber substrate 34 and the vibration plate 36 and is fixed to a surface of the vibration plate 36, for example, with an adhesive. The piezoelectric elements 38 are housed inside recessed portions formed on a surface of the sealing body 44 that faces the vibration plate 36.

As illustrated in FIG. 3, for example, a wiring board 50 is bonded to the surface of the vibration plate 36 (or the surface of the pressure chamber substrate 34). The wiring board 50 is a mounting component in which a plurality of wires (not illustrated) for electrically connecting the control unit 20 or the power supply circuit (not illustrated) and the liquid ejecting head 26 are formed. The wiring board 50, which is flexible, such as a flexible printed circuit (FPC) or a flexible flat cable (FFC) is suitably adopted. A drive signal for driving the piezoelectric elements 38 is supplied from the wiring board 50 to each of the piezoelectric elements 38.

Figure 4:
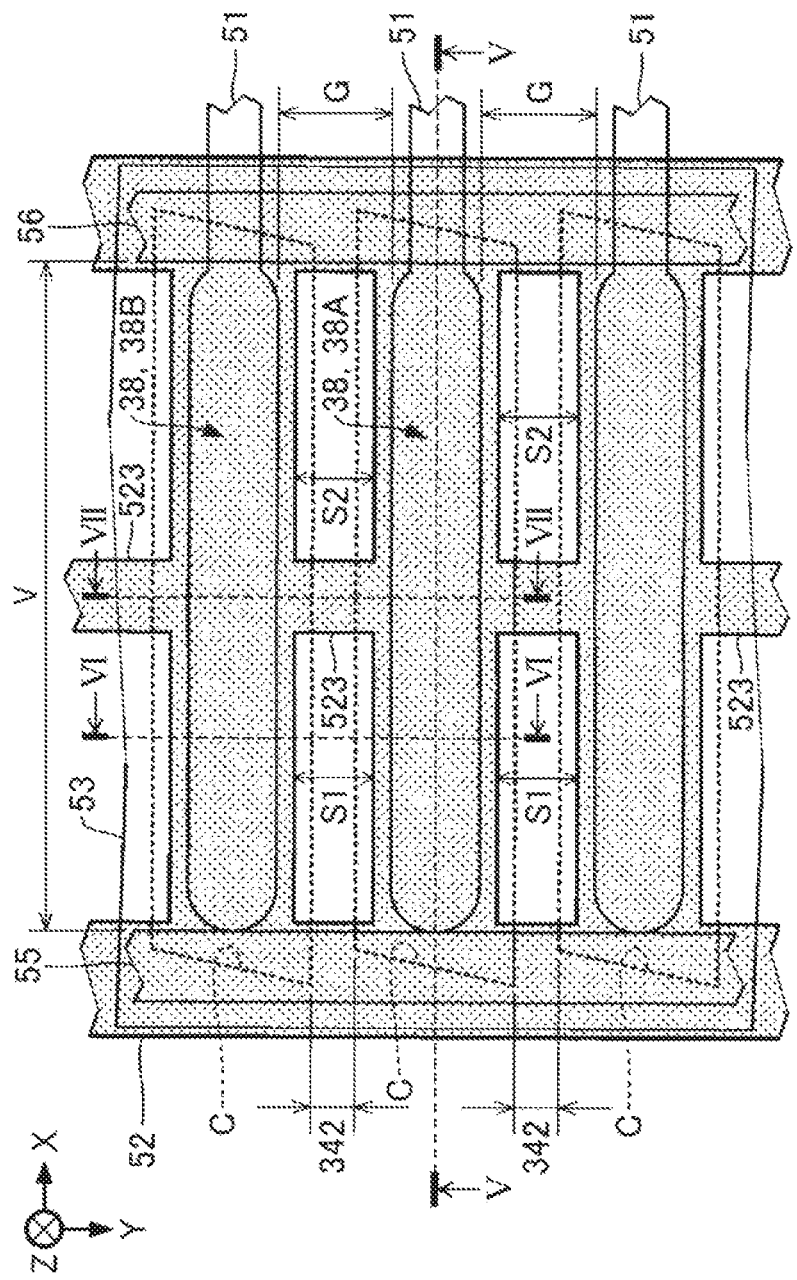
FIG. 4 is a plan view of a plurality of piezoelectric elements.

A specific configuration of each of the piezoelectric elements 38 will be described in detail below. FIG. 4 is a plan view of the piezoelectric elements 38. Further, in FIG. 4, the peripheral edge of an element located on the rear side of any single element (a portion which is originally hidden by the element on the near side) is also illustrated by a solid line for the sake of convenience. In addition, FIG. 5 is a sectional view taken along the line V-V in FIG. 4 (a section along the longitudinal direction of the piezoelectric element 38).

Figure 5:
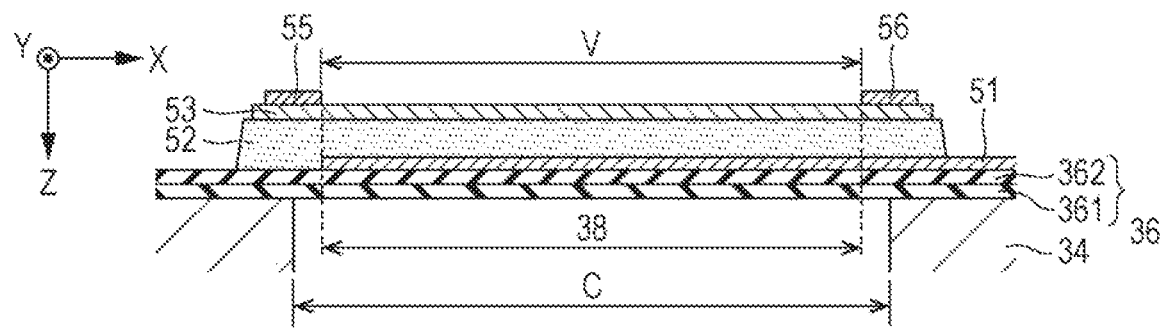
FIG. 5 is a sectional view taken along the line V-V in FIG. 4.

As illustrated in FIG. 4 and FIG. 5, the piezoelectric elements 38 are each formed by stacking a first electrode 51, a piezoelectric layer 52, and a second electrode 53. Further, in the present specification, the expression "the element A and the element B are stacked" is not intended to be limited to a configuration in which the element A and the element B are in direct contact with each other. That is, a configuration in which another element C is interposed between the element A and the element B is included in the concept "the element A and the element B are stacked". In addition, the expression "the element B is formed on the surface of the element A" is not limited to a configuration in which the element A and the element B are in direct contact with each other as well. That is, as long as the element A and the element B at least partially overlap in plan view, a configuration in which the element C is formed on the surface of the element A and the element B is formed on the surface of the element C is included in the concept "the element B is formed on the surface of the element A".

The first electrodes 51 are formed on the surface of the vibration plate 36 (specifically, the surface of the second layer 362). The first electrodes 51 are individual electrodes formed so as to be separated from each other for each of the piezoelectric elements 38. Specifically, the first electrodes 51 extending in the X direction are disposed in the Y direction at intervals. The material and manufacturing method of the first electrodes 51 are arbitrary. For example, it is possible to form the first electrodes 51 by forming a thin film of any of various conductive materials by a known deposition technique such as sputtering and selectively removing portions of the thin film by a known processing technique such as photolithography. A drive signal for controlling the ejection of liquid from the nozzles N corresponding to the piezoelectric elements 38 is applied to the first electrode 51 of each of the piezoelectric elements 38.

The piezoelectric layer 52 is formed on the surface of the first electrode 51. Further, in FIG. 4, shading is added to the piezoelectric layer 52 for the sake of convenience. The piezoelectric layer 52 is a band-shaped dielectric film extending in the Y direction so as to be continuous over the piezoelectric elements 38. The material and manufacturing method of the piezoelectric layer 52 are arbitrary. For example, the piezoelectric layer 52 can be formed by forming a thin film of a piezoelectric material such as lead zirconate titanate by a known deposition technique such as sputtering and then selectively removing portions of the thin film by a known processing technique such as photolithography.

The second electrode 53 is formed on the surface of the piezoelectric layer 52. Specifically, the second electrode 53 is a band-like common electrode extending in the Y direction so as to be continuous over the piezoelectric elements 38 (or the pressure chambers C). A predetermined reference voltage is applied to the second electrode 53. For example, it is possible to form the second electrode 53 by forming a thin film of any of various conductive materials by a known deposition technique such as sputtering and selectively removing portions of the thin film by a known processing technique such as photolithography.

Each of the piezoelectric elements 38 is formed by stacking the first electrode 51, the piezoelectric layer 52, and the second electrode 53. The piezoelectric elements 38 are individually formed for each of the pressure chambers C (or for each of the nozzles N). The piezoelectric elements 38 elongated in the X direction are disposed in the Y direction with a space therebetween. The Y-direction size (that is, the width) of each of the piezoelectric elements 38 is smaller than the Y-direction size of the pressure chamber C in the Y direction. A portion (so-called active portion) of the piezoelectric layer 52 interposed between the first electrode 51 and the second electrode 53 deforms in accordance with the voltage difference between the reference voltage applied to the first electrode 51 and the drive signal supplied to the second electrode 53.

A first conductor 55 and a second conductor 56 are formed on the surface of the second electrode 53. The first conductor 55 is a band-like conductive film extending in the Y direction along the edge of the second electrode 53 on the negative side in the X direction. The second conductor 56 is a band-like conductive film extending in the Y direction along the edge of the second electrode 53 on the positive side in the X direction. The first conductor 55 and the second conductor 56 are formed in the same layer by using a low-resistance conductive material such as gold, for example. By forming the first conductor 55 and the second conductor 56, a voltage drop of the reference voltage at the second electrode 53 is suppressed. In addition, the first conductor 55 and the second conductor 56 also function as weights for suppressing the vibration of the vibration plate 36. That is, the region of the vibration plate 36 between the first conductor 55 and the second conductor 56 is a vibration region V that vibrates in conjunction with the piezoelectric element 38.

The vibration plate 36 and the piezoelectric element 38 function as a piezoelectric device that vibrates upon supply of a drive signal. The liquid ejecting head 26 includes the pressure chamber C that houses ink and a piezoelectric device for ejecting ink from the pressure chamber C.

Figure 6:
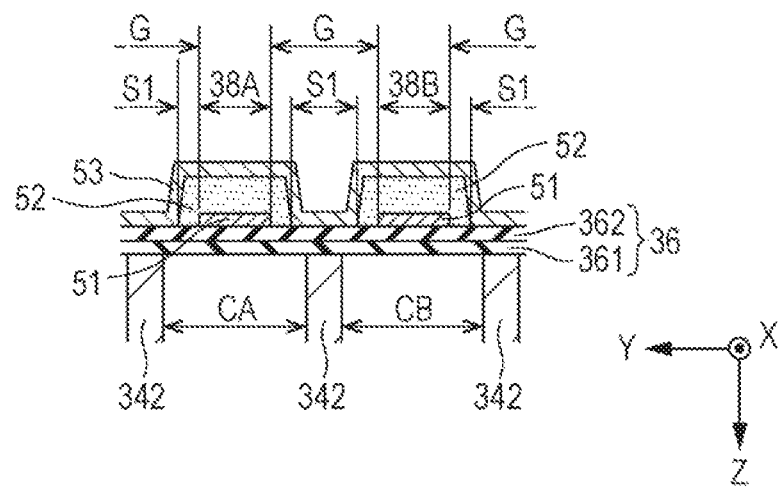
FIG. 6 is a sectional view taken along the line VI-VI in FIG. 4.
Figure 7:
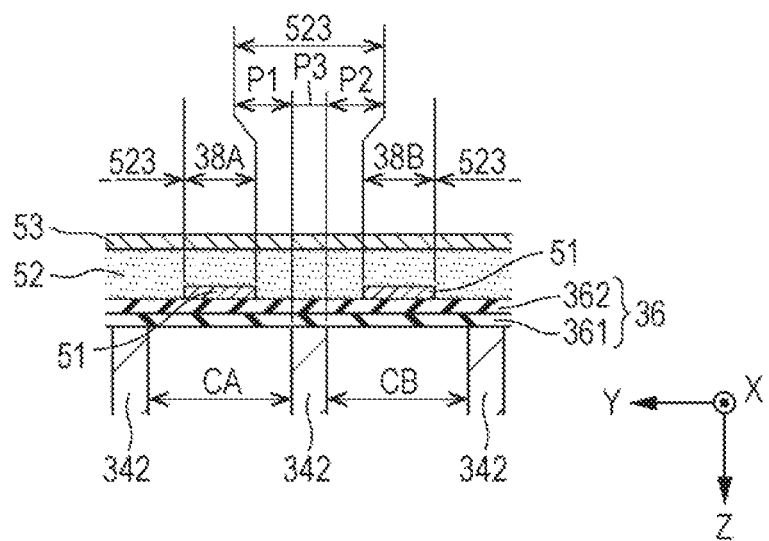
FIG. 7 is a sectional view taken along the line VII-VII in FIG. 4.

FIG. 6 is a sectional view taken along the line VI-VI in FIG. 4, and FIG. 7 is a sectional view taken along the line VII-VII in FIG. 4. As illustrated in FIG. 6 and FIG. 7, an arbitrary two of the piezoelectric elements 38 adjacent to each other in the Y direction are represented as a first piezoelectric element 38A and a second piezoelectric element 38B for the sake of convenience.

In FIG. 4 and FIG. 6, a region G (hereinafter referred to as "inter-element region") located between the first piezoelectric element 38A and the second piezoelectric element 38B in plan view of the piezoelectric layer 52 is illustrated. An inter-element region G is an elongated region linearly extending in the X direction between the first piezoelectric element 38A and the second piezoelectric element 38B. As illustrated in FIG. 4 and FIG. 6, a first opening portion S1 and a second opening portion S2 are formed in the inter-element region G of the piezoelectric layer 52. Each of the first opening portion S1 and the second opening portion S2 is an elongated through hole (that is, a slit) extending linearly in the X direction. The planar shapes of the first opening portion S1 and the second opening portion S2 in the first embodiment are rectangular. Further, in the following description, when it is not necessary to distinguish between the first opening portion S1 and the second opening portion S2, they are simply referred to as "opening portions S".

The first opening portion S1 and the second opening portion S2 are disposed in the X direction intersecting the Y direction in which the first piezoelectric element 38A and the second piezoelectric element 38B are disposed. The first opening portion S1 and the second opening portion S2 are disposed in the X direction with a space therebetween. Therefore, as exemplified in FIG. 4 and FIG. 7, a portion of the piezoelectric layer 52, which is hereinafter referred to as a vibration suppressing portion 523, exists between the first opening portion S1 and the second opening portion S2. The vibration suppressing portion 523 is a portion that extends in the Y direction so as to connect the first piezoelectric element 38A and the second piezoelectric element 38B to each other. As understood from the above description, the first opening portion S1, the second opening portion S2, and the vibration suppressing portion 523 are formed in the inter-element region G between the first piezoelectric element 38A and the second piezoelectric element 38B in the piezoelectric layer 52. Because the planar shape of each of the opening portions S is a rectangle, the width (dimension in the X direction) of the vibration suppressing portion 523 is constant over the entire Y direction.

As described above, according to the configuration in which the first opening portion S1 and the second opening portion S2 are formed in the inter-element region G, propagation of vibrations between the first piezoelectric element 38A and the second piezoelectric element 38B is suppressed. Therefore, it is possible to highly accurately control the ink ejection characteristics (for example, the ejection amount, the ejection direction, and the ejection velocity) of each of the nozzles N.

The vibration suppressing portion 523 is formed at a position corresponding to the center of the vibration region V of the vibration plate 36 in the X direction. Specifically, the vibration suppressing portion 523 is located within a predetermined range including the midpoint of the vibration region V in the X direction. In the first embodiment, because each of the piezoelectric elements 38 is formed over the entire vibration region V in the X direction, it is also said that the vibration suppressing portion 523 is located at a position corresponding to the center of the piezoelectric element 38 in the X direction.

FIG. 6 and FIG. 7 illustrate a pressure chamber CA corresponding to the first piezoelectric element 38A and a pressure chamber CB corresponding to the second piezoelectric element 38B among the pressure chambers C. The pressure chamber CA (an example of a first space) is a space located on the opposite side to the first piezoelectric element 38A with the vibration plate 36 interposed therebetween, and the pressure chamber CB (an example of a second space) is a space located on the opposite side to the second piezoelectric element 38B with the vibration plate 36 interposed therebetween.

A partition wall portion 342 is formed between the pressure chamber CA and the pressure chamber CB. The partition wall portion 342 is a wall-like portion of the pressure chamber substrate 34 extending in the X direction. As can be understood from FIG. 4 and FIG. 7, the vibration suppressing portion 523 overlaps the partition wall portion 342 between the pressure chamber CA and the pressure chamber CB in plan view. Specifically, as illustrated in FIG. 7, the vibration suppressing portion 523 includes a first portion P1 connected to the first piezoelectric element 38A, a second portion P2 connected to the second piezoelectric element 38B, and a third portion P3 located between the first portion P1 and the second portion P2. The first portion P1 overlaps the pressure chamber CA in plan view, and the second portion P2 overlaps the pressure chamber CB in plan view. The third portion P3 of the vibration suppressing portion 523 overlaps the partition wall portion 342 in plan view.

As described above, in the first embodiment, the vibration suppressing portion 523 is formed between the first opening portion S1 and the second opening portion S2 in the inter-element region G between two of the piezoelectric elements 38 adjacent to each other. Because vibration of the vibration plate 36 is suppressed by the vibration suppressing portion 523, it is possible to suppress cracks in the vibration plate 36 (in particular, the portions within the regions where the opening portions S are formed). The stress generated in the vibration plate 36 becomes marked in the vicinity of the center of the vibration region V in the X direction. In the first embodiment, because the vibration suppressing portion 523 is formed at a position corresponding to the center of the vibration region V in the X direction, it is possible to improve the aforementioned effect that the crack of the vibration plate 36 can be suppressed.

In addition, in the first embodiment, the vibration suppressing portion 523 overlaps the partition wall portion 342 between the pressure chamber CA and the pressure chamber CB in plan view. That is, the mechanical strength of the partition wall portion 342 is reinforced by the vibration suppressing portion 523. Therefore, there is an advantage that the deformation (eventually, collapse) of the partition wall portion 342 can be suppressed.

Second Embodiment

A second embodiment of the invention will be described. Further, it should be noted that, in each of the examples described below, the same reference numerals used in the description of the first embodiment are used for the elements whose functions are the same as those of the first embodiment, and detailed description thereof will be appropriately omitted.

Figure 8:
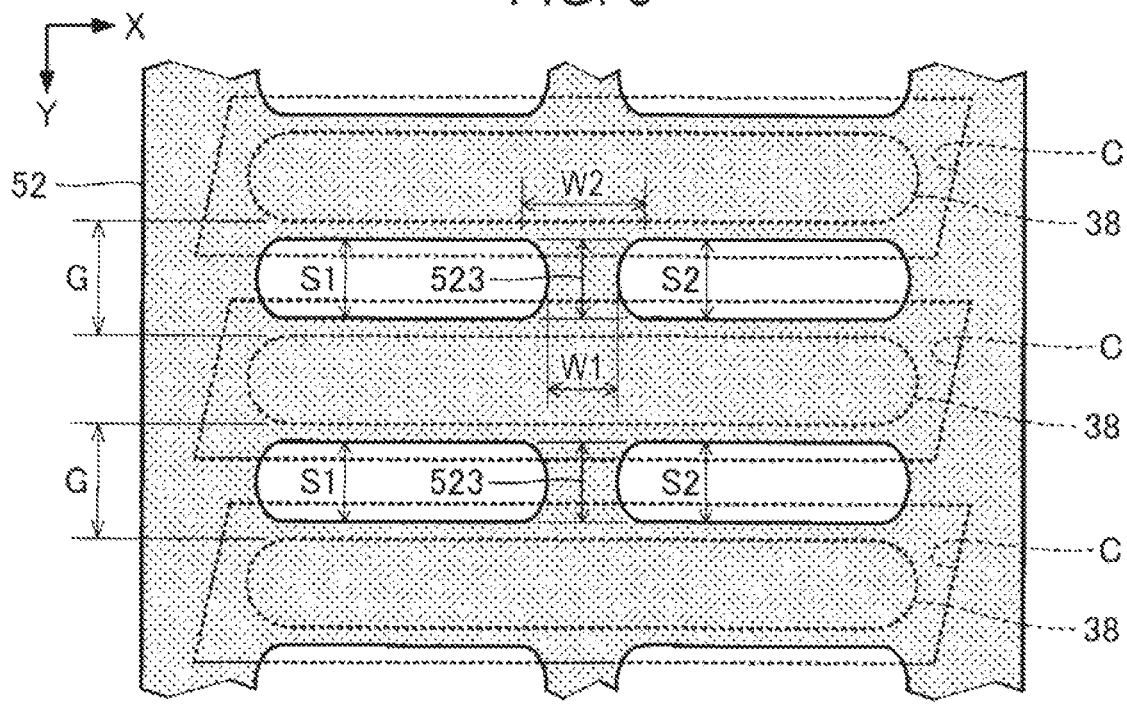
FIG. 8 is a plan view of a piezoelectric layer of a second embodiment.

FIG. 8 is a plan view of the piezoelectric elements 38 of the second embodiment. In the first embodiment, the configuration in which the planar shape of each of the opening portions S is a rectangle has been exemplified. In the second embodiment, the vicinities of both end portions of each of the opening portions S are formed in an arc shape in plan view, as illustrated in FIG. 8. That is, each of the opening portions S is formed into a planar shape having a smaller Y-direction size (that is, width) toward both end portions. Therefore, as exemplified in FIG. 8, the width W1 of the vibration suppressing portion 523 at the center in the Y direction is smaller than the width W2 at both ends in the Y direction (W1<W2).

The second embodiment achieves the same effect as the first embodiment. Further, in the first embodiment, there is a possibility that stress concentrates in the vicinity of the four corners of each of the opening portions S in the piezoelectric layer 52. In the second embodiment, because the width W1 of the vibration suppressing portion 523 at the center in the Y direction is smaller than the width W2 at both ends, concentration of stress around each of the opening portions S is alleviated as compared with the first embodiment. Therefore, as compared with the first embodiment in which the width of the vibration suppressing portion 523 is constant over the entire region, the likelihood of cracks occurring due to stress concentration on the vibration plate 36 in the region where the opening portions S are formed can be reduced.

Figure 9:
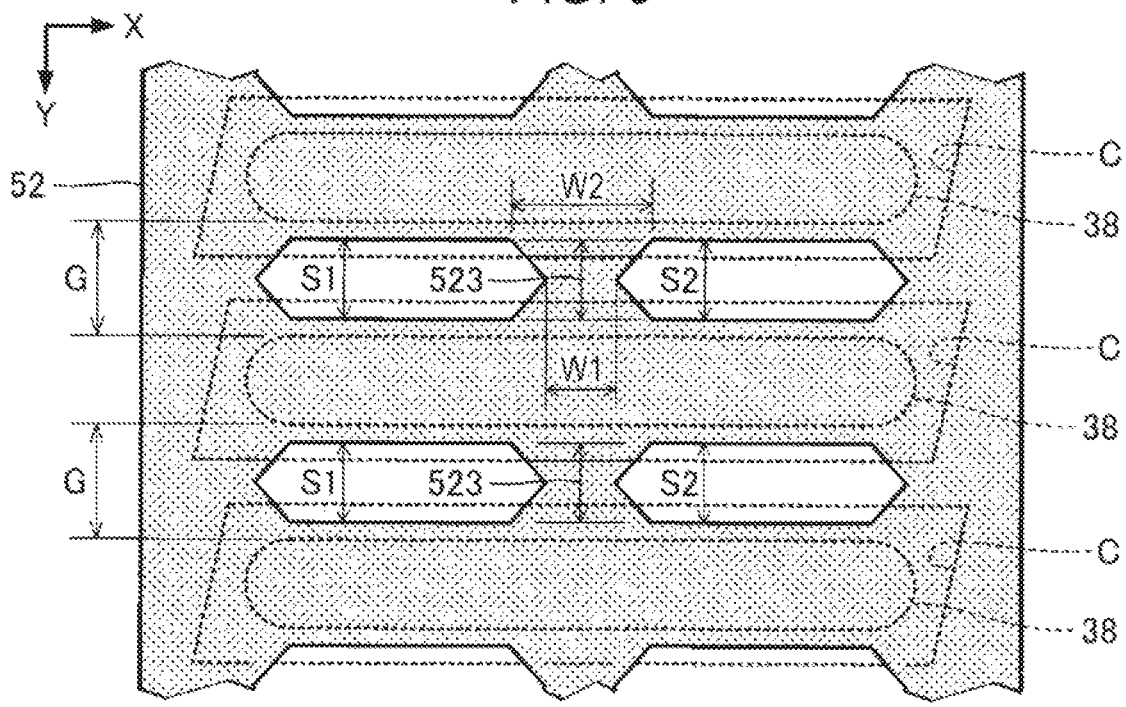
FIG. 9 is a plan view of a piezoelectric layer of another example of the second embodiment.

Further, the planar shape of each of the opening portions S is not limited to the above example. For example, as illustrated in FIG. 9, the planar shape of each of the opening portions S may be a polygonal shape (for example, a hexagonal shape). Also in the configuration of FIG. 9, similarly to the second embodiment (FIG. 8), each of the opening portions S is formed in a planar shape having a smaller Y-direction size (that is, width) toward both end portions. That is, the width W1 of the vibration suppressing portion 523 at the center in the Y direction is smaller than the width W2 at both ends in the Y direction (W1<W2). Therefore, the same effect as in the second embodiment is realized also in the configuration of FIG. 9.

Third Embodiment

Figure 10:
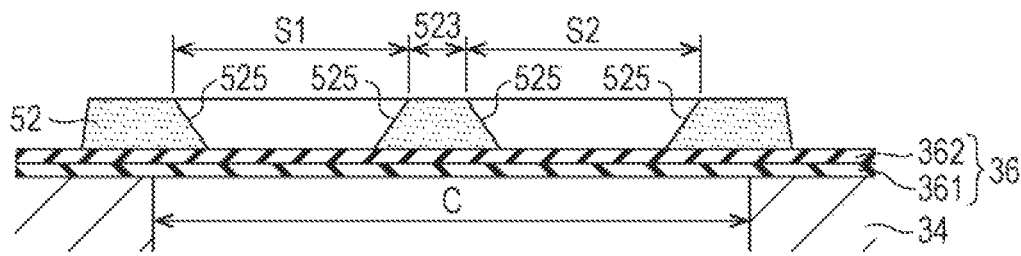
FIG. 10 is a sectional view of a piezoelectric layer of a third embodiment.

FIG. 10 is a sectional view of the piezoelectric layer 52 of a third embodiment. In FIG. 10, a configuration of a section parallel to the YZ plane in the inter-element region G is illustrated. As illustrated in FIG. 10, the inner wall surfaces at both end portions in the X direction at each of the opening portions S are inclined surfaces 525 that are inclined with respect to the surface of the vibration plate 36. The inclined surfaces 525 are flat surfaces that are inclined so that the thickness of the piezoelectric layer 52 decreases at positions closer to the centers of the respective opening portions S in the X direction. Focusing on the vibration suppressing portion 523, it can be said that the side surfaces of the vibration suppressing portion 523 are the inclined surfaces 525 inclined with respect to the surface of the vibration plate 36.

The third embodiment achieves the same effect as the first embodiment. Further, according to the third embodiment, as compared with the configuration in which the inner wall surface at the end portion of each of the opening portions S is a plane perpendicular to the vibration plate 36, cracks in the vibration plate 36 in the region where the opening portions S are formed can be effectively suppressed.

Fourth Embodiment

The vibration plate 36 may instantaneously resonate upon application of a high-frequency voltage such as drive signal noise. In the fourth embodiment, the vibration suppressing portions 523 are formed at positions corresponding to antinodes of vibration of a specific vibration mode at resonance.

Figure 11:
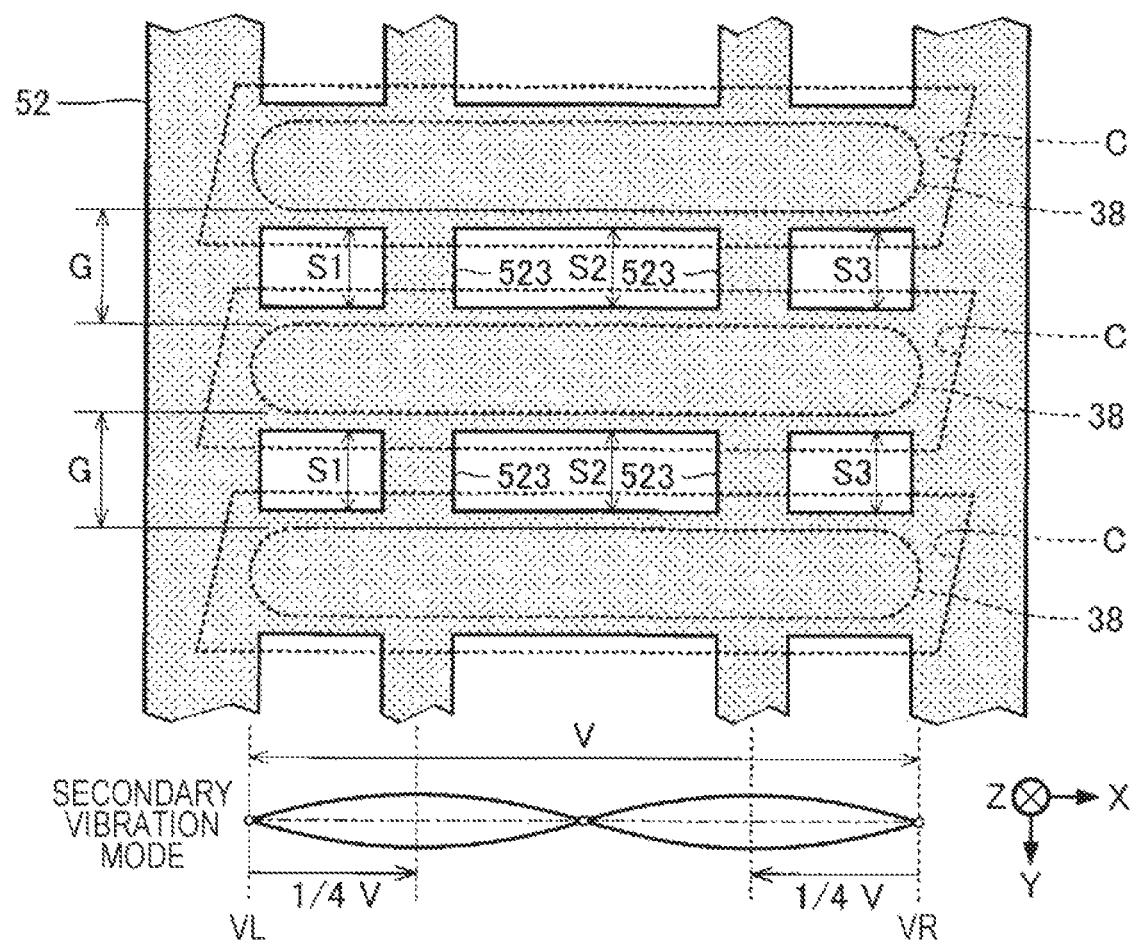
FIG. 11 is a plan view of a piezoelectric layer of a fourth embodiment.

FIG. 11 is a plan view of the piezoelectric layer 52 in the fourth embodiment. In FIG. 11, a secondary vibration mode generated in the vibration region V is also represented. As illustrated in FIG. 11, in the fourth embodiment, the vibration suppressing portions 523 are formed at positions corresponding to antinodes of vibration of the secondary vibration mode in the inter-element regions G of the piezoelectric layer 52. More specifically, the vibration suppressing portions 523 are formed at positions spaced apart from a left end VL of the vibration region V by a quarter of the vibration region V to the positive side in the X direction, and the vibration suppressing portions 523 are formed at positions spaced apart from a right end VR of the vibration region V by a quarter of the vibration region V to the negative side in the X direction. Specifically, the first opening portion S1, the second opening portion S2, and the third opening portion S3 are formed in each of the inter-element regions G, and the vibration suppressing portions 523 are formed between the opening portions S. As understood from the above description, in the fourth embodiment, the vibration suppressing portions 523 are formed at positions that are equidistant from the left end VL and right end VR of the vibration region V.

Also in the fourth embodiment, the same effect as in the first embodiment is realized. In addition, in the fourth embodiment, because the vibration suppressing portions 523 are formed at positions corresponding to antinodes of vibration of a specific vibration mode in the vibration plate 36, the vibration of the vibration plate 36 is effectively suppressed. Further, although a secondary vibration mode is exemplified in FIG. 11, the vibration suppressing portions 523 may be formed at positions corresponding to antinodes of vibration of a tertiary or higher vibration mode. In addition, the configuration of the first embodiment in which the vibration suppressing portion 523 is formed at the midpoint of the vibration region V can also be expressed as a configuration in which the vibration suppressing portion 523 is formed at a position corresponding to an antinode of vibration of a primary vibration mode.

MODIFICATION EXAMPLES

Each embodiment exemplified above can be modified in various ways. Specific modification examples that can be applied to each of the above-described embodiments are given below. Further, two or more examples arbitrarily chosen from the following examples can be combined appropriately as long as they do not contradict each other.

Figure 12:
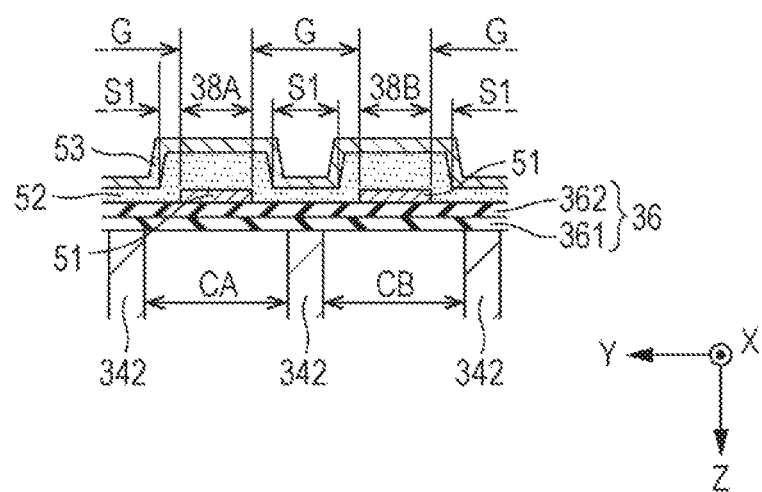
FIG. 12 is a sectional view of a plurality of piezoelectric elements of a modification example.

(1) In each of the above-described embodiments, through holes formed in the piezoelectric layer 52 are exemplified as the opening portions S, but a configuration in which the opening portions S penetrate the piezoelectric layer 52 is optional. For example, as illustrated in FIG. 12, recessed portions (that is, bottomed holes) from which portions of the piezoelectric layer 52 in the film thickness direction have been removed may be formed as the opening portions S.

(2) In each of the above embodiments, a configuration in which the first electrode 51 is the individual electrode and the second electrode 53 is the common electrode has been exemplified; however, the first electrode 51 may be a continuous common electrode over the piezoelectric elements 38, and the second electrode 53 may be set as a separate individual electrode for each of the piezoelectric elements 38. In addition, both of the first electrode 51 and the second electrode 53 may be individual electrodes.

(3) In each of the above-described embodiments, the liquid ejecting apparatus 100 that is of the serial type and that reciprocates the transport body 242 with the liquid ejecting head 26 mounted thereon is exemplified, but the invention is also applicable to a line type liquid ejecting apparatus in which a plurality of nozzles N are distributed over the entire width of the medium 12.

(4) The liquid ejecting apparatus 100 exemplified in each of the above-described embodiments can be employed in various apparatuses such as a facsimile apparatus and a copying machine, in addition to an apparatus dedicated for printing. However, the use of the liquid ejecting apparatus of this invention is not limited to printing. For example, a liquid ejecting apparatus that ejects a solution of color materials can be used as a manufacturing device for forming the color filters of liquid crystal displays. In addition, a liquid ejecting apparatus that ejects a solution of conductive materials can be used as a manufacturing device for forming wiring or electrodes of a wiring board or the like.

(5) The piezoelectric device including the vibration plate 36 and the piezoelectric elements 38 can be applied to other devices such as an ultrasonic sensor, an ultrasonic transducer, an ultrasonic motor or the like in addition to the liquid ejecting head 26.

What is claimed is:

1. A piezoelectric device comprising:
a vibration plate; and
a first piezoelectric element and a second piezoelectric element that vibrate the vibration plate,
wherein the first piezoelectric element and the second piezoelectric element include a piezoelectric layer extending between the first piezoelectric element and the second piezoelectric element, and
wherein, in a region of the piezoelectric layer between the first piezoelectric element and the second piezoelectric element, a first opening portion and a second opening portion are formed in a second direction intersecting a first direction in which the first piezoelectric element and the second piezoelectric element are disposed so as to interpose a vibration suppressing portion, which is a portion of the piezoelectric layer.

2. The piezoelectric device according to claim 1,
wherein the vibration suppressing portion is formed at a position corresponding to a center of a vibration region of the vibration plate in the second direction, the vibration region being a region that the first piezoelectric element and the second piezoelectric element vibrate.

3. The piezoelectric device according to claim 1,
wherein the vibration suppressing portion is formed at a position corresponding to an antinode of vibration of a specific vibration mode in the vibration plate.

4. The piezoelectric device according to claim 1,
wherein a width of a center of the vibration suppressing portion in the first direction is smaller than a width of both ends of the vibration suppressing portion in the first direction.

5. The piezoelectric device according to claim 1,
wherein inner wall surfaces at end portions of the first opening portion and the second opening portion in the second direction include an inclined surface that is inclined so that a thickness of the piezoelectric layer decreases toward a center in the second direction.

6. The piezoelectric device according to claim 1, further comprising:
a first space located on a side opposite to the first piezoelectric element with the vibration plate interposed between the first space and the first piezoelectric element; and
a second space located on a side opposite to the second piezoelectric element with the vibration plate interposed between the second space and the second piezoelectric element,
wherein the vibration suppressing portion overlaps a partition wall portion between the first space and the second space in plan view.

7. A liquid ejecting head comprising:
a pressure chamber that houses a liquid; and
a piezoelectric device that ejects the liquid from the pressure chamber,
wherein the piezoelectric device includes a vibration plate that forms a wall surface of the pressure chamber, and a first piezoelectric element and a second piezoelectric element that vibrate the vibration plate,
wherein the first piezoelectric element and the second piezoelectric element include a piezoelectric layer extending between the first piezoelectric element and the second piezoelectric element, and
wherein, in a region of the piezoelectric layer between the first piezoelectric element and the second piezoelectric element, a first opening portion and a second opening portion disposed in a second direction intersecting a first direction in which the first piezoelectric element and the second piezoelectric element are disposed, and a vibration suppressing portion that connects the first piezoelectric element and the second piezoelectric element between the first opening portion and the second opening portion are formed.

8. A liquid ejecting apparatus comprising the liquid ejecting head according to claim 7.

* * * * *